(12) United States Patent
Jung

(10) Patent No.: US 10,497,835 B2
(45) Date of Patent: Dec. 3, 2019

(54) LIGHT EMITTING DEVICE, LIGHT EMITTING ELEMENT PACKAGE, AND LIGHT EMITTING DEVICE

(71) Applicant: LG INNOTEK CO., LTD., Seoul (KR)

(72) Inventor: Se Yeon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/762,356

(22) PCT Filed: Sep. 26, 2016

(86) PCT No.: PCT/KR2016/010785
§ 371 (c)(1),
(2) Date: Mar. 22, 2018

(87) PCT Pub. No.: WO2017/052344
PCT Pub. Date: Mar. 30, 2017

(65) Prior Publication Data
US 2018/0358513 A1     Dec. 13, 2018

(30) Foreign Application Priority Data

Sep. 25, 2015    (KR) ........................ 10-2015-0136863

(51) Int. Cl.
*H01L 33/38*        (2010.01)
*H01L 33/06*        (2010.01)
(Continued)

(52) U.S. Cl.
CPC ............ *H01L 33/387* (2013.01); *H01L 33/06* (2013.01); *H01L 33/12* (2013.01); *H01L 33/22* (2013.01);
(Continued)

(58) Field of Classification Search
CPC ....... H01L 33/20; H01L 33/38; H01L 33/387; H01L 2933/0016
See application file for complete search history.

(56) References Cited

U.S. PATENT DOCUMENTS

2007/0190675 A1*   8/2007   Yamazaki ............. H01J 9/2275
                                                                        438/22
2009/0039374 A1    2/2009   Yahata et al.
(Continued)

FOREIGN PATENT DOCUMENTS

JP        2009-043934      2/2009
JP           4415575      2/2010
(Continued)

OTHER PUBLICATIONS

International Search Report (with English Translation) and Written Opinion dated Jan. 12, 2017 issued in Application No. PCT/KR2016/010785.

*Primary Examiner* — Allan R Wilson
(74) *Attorney, Agent, or Firm* — Ked & Associates, LLP

(57) ABSTRACT

A light emitting element according to one embodiment can comprise: a first conductive semiconductor layer; an active layer on the first conductive semiconductor layer; a second conductive semiconductor layer on the active layer; a light-transmitting ohmic layer on the second conductive semiconductor layer; a first electrode electrically connected with the first conductive semiconductor layer; and a second electrode on the light-transmitting ohmic layer. The light emitting element can include two first sides facing each other, and two second sides facing each other. The width of the first side is greater than the width of the second side, and the first side and the second side can be perpendicular to each other. The distance between the first branch electrode and the second branch electrode is ⅙ to ½ of the width of the second side of either one thereof.

21 Claims, 7 Drawing Sheets

(51) Int. Cl.
*H01L 33/12* (2010.01)
*H01L 33/22* (2010.01)
*H01L 33/30* (2010.01)
*H01L 33/32* (2010.01)
*H01L 33/40* (2010.01)
*H01L 33/42* (2010.01)
*H01L 33/44* (2010.01)
*H01L 33/48* (2010.01)
*H01L 33/50* (2010.01)
*H01L 33/56* (2010.01)
*H01L 33/60* (2010.01)
*H01L 33/62* (2010.01)
*H01L 33/14* (2010.01)
*H01L 33/20* (2010.01)

(52) U.S. Cl.
CPC .............. *H01L 33/30* (2013.01); *H01L 33/32* (2013.01); *H01L 33/38* (2013.01); *H01L 33/405* (2013.01); *H01L 33/42* (2013.01); *H01L 33/44* (2013.01); *H01L 33/486* (2013.01); *H01L 33/502* (2013.01); *H01L 33/56* (2013.01); *H01L 33/60* (2013.01); *H01L 33/62* (2013.01); *H01L 33/145* (2013.01); *H01L 33/20* (2013.01); *H01L 2224/48091* (2013.01); *H01L 2924/181* (2013.01); *H01L 2933/0016* (2013.01)

(56) References Cited

U.S. PATENT DOCUMENTS

| | | | | |
|---|---|---|---|---|
| 2011/0316030 | A1* | 12/2011 | Togawa | H01L 33/387 257/98 |
| 2012/0007129 | A1 | 1/2012 | Beom et al. | |
| 2012/0049223 | A1* | 3/2012 | Yang | H01L 33/38 257/98 |
| 2012/0098023 | A1 | 4/2012 | Weng et al. | |
| 2012/0113673 | A1 | 5/2012 | Na et al. | |
| 2012/0241808 | A1* | 9/2012 | Akiyama | H01L 33/22 257/99 |
| 2013/0234192 | A1* | 9/2013 | Kim | H01L 33/0008 257/98 |
| 2014/0175503 | A1* | 6/2014 | Hwang | H01L 33/38 257/99 |
| 2017/0069795 | A1* | 3/2017 | Kim | H01L 33/06 |

FOREIGN PATENT DOCUMENTS

| | | |
|---|---|---|
| JP | 2012-089695 | 5/2012 |
| KR | 10-0631975 | 9/2006 |
| KR | 10-2012-0064870 | 6/2012 |
| KR | 10-2012-0086876 | 8/2012 |
| KR | 10-2014-0062945 | 5/2014 |

* cited by examiner

LIGHT EMITTING DEVICE, LIGHT EMITTING ELEMENT PACKAGE, AND LIGHT EMITTING DEVICE

CROSS-REFERENCE TO RELATED PATENT APPLICATIONS

This application is a U.S. National Stage Application under 35 U.S.C. § 371 of PCT Application No. PCT/KR2016/010785, filed Sep. 26, 2016, which claims priority to Korean Patent Application No. 10-2015-0136863, filed Sep. 25, 2015, whose entire disclosures are hereby incorporated by reference.

TECHNICAL FIELD

An embodiment relates to a light emitting device, a manufacturing method of the light emitting device, a light emitting device package, and a light emitting device.

BACKGROUND ART

A light emitting device (LED) is a p-n junction diode having a characteristic in which electric energy is converted into light energy, and may be formed by compounding Group III and Group V elements on the periodic table. An LED may represent various colors by adjusting a composition ratio of a compound semiconductor.

In a LED, when a forward voltage is applied, electrons of an n layer are combined with holes of a p layer, and energy corresponding to band gap energy between a conduction band and a valence band may be generated, and when the energy is emitted in the form of light, the LED functions.

For example, a nitride semiconductor has received a great interest in a development field of an optical device and a high-output electronic device due to high thermal stability and wide band gap energy thereof. In particular, a blue LED, a green LED and an UV LED using the nitride semiconductor are commercialized and used widely.

The LED may be classified into a lateral type and a vertical type depending on a location of an electrode.

A lateral type LED among LEDs according to the related art is formed such that a nitride semiconductor layer is formed on a substrate and two electrode layers are disposed on an upper side of the nitride semiconductor layer.

Meanwhile, recently, light emitting devices have been applied for various IT devices and mobile phones, and a small LED chip has been adopted as a light emitting device for IT devices and mobile phones. For example, recently, a small lateral LED chip has been adopted for mobile phones.

Meanwhile, since the distance between an n-electrode and a p-electrode is limited according to the restriction of the size of a LED chip for mobile phones in the related art, there is a technical problem that design of a distance between electrodes considering a current spreading length is not reflected.

DISCLOSURE

Technical Problem

An embodiment is directed to providing a light emitting device which is capable of enhancing optical characteristics, a manufacturing method of the light emitting device, a light emitting device package and a lighting emitting device.

Technical Solution

A light emitting device according to an embodiment may include a first conductive semiconductor layer, an active layer on the first conductive semiconductor layer, a second conductive semiconductor layer on the active layer, a light-transmitting ohmic layer on the second conductive semiconductor layer, a first electrode electrically connected to the first conductive semiconductor layer, and a second electrode on the light-transmitting ohmic layer.

In the embodiment, the first electrode may include a first pad electrode and a first branched electrode, and the second electrode may include a second pad electrode and a second branched electrode.

The light emitting device may include two first sides facing each other and two second sides facing each other. The width of the first side may be greater than that of the second side, and the first side and the second side may be orthogonal to each other. The distance between the first branched electrode and the second branched electrode may be ⅙ to ½ of the width of any one of the second sides.

For example, the light emitting device of the embodiment may include two long sides facing each other and two short sides facing each other, and the long side and the short side may be orthogonal to each other. Accordingly, the light emitting device may have a rectangular shape including a long side and a short side. In this case, the distance between the first branched electrode and the second branched electrode may be ⅙ to ½ of the short side width of the light emitting device.

A light emitting device package according to the embodiment may include the light emitting device.

A light emitting device according to the embodiment may include the light emitting device package.

Advantageous Effects

Embodiments can provide a light emitting device which is capable of enhancing optical characteristics thereof through designing a distance between electrodes considering a current spreading length, a manufacturing method of the light emitting device, a light emitting device package and a lighting emitting device.

For example, according to an embodiment, in designing an electrode of a light emitting device chip, particularly regarding the design of the distance between the first branched electrode on an n-type semiconductor layer and the second branched electrode on a p-type semiconductor layer, an operation voltage Vf can be lowered by calculating a current spreading length Ls through the analysis of the light emitting device chip and designing a distance between the branched electrodes suitable for Ls, and there is a technical effect that a light output Po is at an equivalent level or increased.

MODES OF THE INVENTION

In the description of embodiments, it will be understood that when a layer (or film), region, pattern or structure is referred to as being "on/over" or "under" another layer (or film), region, pattern or structure, the terminologies of "on/over" and "under" include both the meanings of "directly" or "by interposing another layer (indirectly)". Further, the reference about "on/over" and "under" each layer will be made on the basis of drawings.

EMBODIMENT

Figure 1:
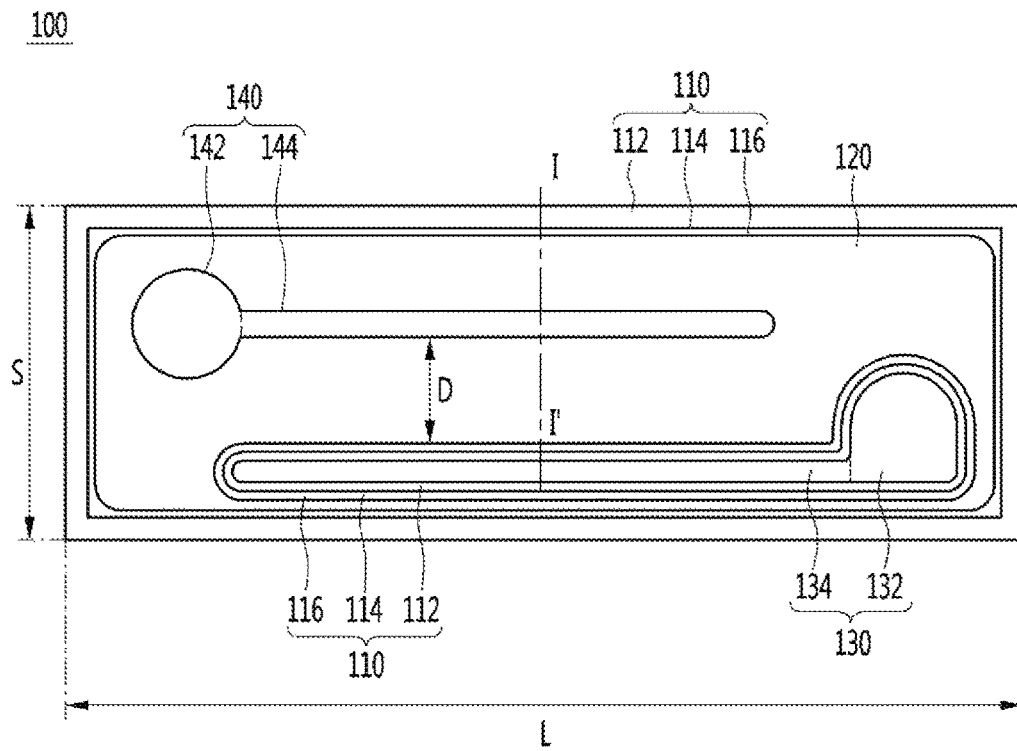
FIG. 1 is a plan view of a light emitting device according to a first embodiment.
Figure 2:
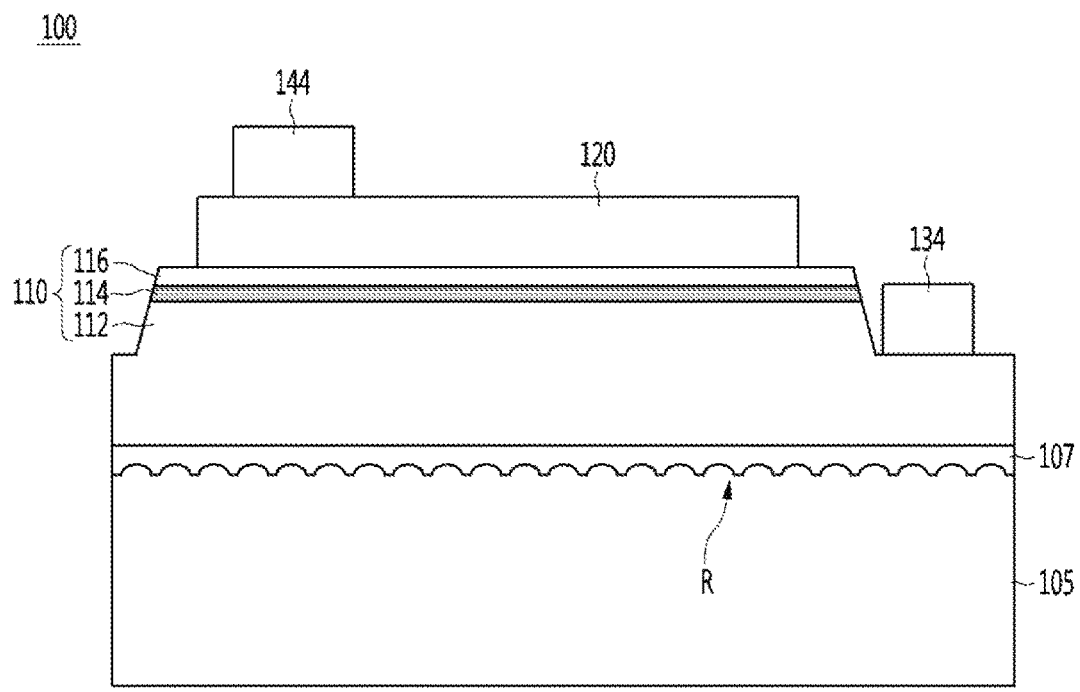
FIG. 2 is a cross-sectional view of a light emitting device according to the first embodiment.

FIG. 1 is a plan view of a light emitting device 100 according to a first embodiment, and FIG. 2 is a cross-sectional view taken along line I-I' of the light emitting device 100 according to an embodiment.

The light emitting device 100 according to the embodiment may include a light emitting structure 110 on a substrate 105.

The substrate 105 may include an insulating substrate or conductive substrate, and may be formed of a single layer or multiple layers. For example, at least one of sapphire ($Al_2O_3$), SiC, Si, GaAs, GaN, ZnO, GaP, InP, Ge, and $Ga_2O_3$, or a combination thereof may be used for the substrate 105, but the present invention is not limited thereto.

A predetermined concave-convex structure R may be formed on the substrate 105 to improve light extraction efficiency, but is not limited thereto.

In the embodiment, a predetermined buffer layer 107 may be formed on the substrate 105 to relieve lattice mismatching between the light emitting structure 110 formed thereafter and the substrate 105.

The buffer layer 107 may be formed of a single layer or multiple layers, and may be formed of at least one of GaN, InN, AlN, InGaN, AlGaN, InAlGaN, and AlInN, or a combination thereof, but is not limited thereto.

The light emitting structure 110 may include a first conductive semiconductor layer 112 on the substrate 105, an active layer 114 on the first conductive semiconductor layer 112 and a second conductive semiconductor layer 116 on the active layer 114.

The first conductive semiconductor layer 112 may include be implemented as a Group III-V compound semiconductor doped with a first conductive dopant. For example, when the first conductive semiconductor layer 112 is an n-type semiconductor layer, the first conductive dopant may include an n-type dopant such as Si, Ge, Sn, Se and Te, but is not limited thereto.

The first conductive semiconductor layer 112 may include a semiconductor material having a composition formula of $In_xAl_yGa_{1-x-y}N$ ($0 \le x \le 1$, $0 \le y \le 1$, $0 \le x+y \le 1$), and may formed in a single layer or multiple layers. For example, the first conductive semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 114 is a layer which emits light having energy determined by an intrinsic energy band of a material of an active layer (light emitting layer), in which electrons injected through the first conductive semiconductor layer 112 and holes injected through the second conductive semiconductor layer 116 formed thereafter meet each other.

The active layer 114 may be formed with at least any one of a single-quantum-well structure, a multi-quantum-well (MQW) structure, a quantum-wire structure, and a quantum-dot structure.

The active layer 114 may have a well layer/barrier layer structure. For example, the active layer 114 may be formed with any one or more pair structures of InGaN/GaN, InGaN/InGaN, GaN/Al GaN, InAlGaN/GaN, GaAs/AlGaAs, GaP/AlGaP, InGaAs/AlGaAs, and InGaP/AlGaP, but is not limited thereto. The well layer may be formed of a material having a band gap lower than a band gap of the barrier layer.

According to the embodiment, an electron blocking layer (not shown) may be formed on the active layer 114. For example, the electron blocking layer may be formed of an $Al_xIn_yGa_{(1-x-y)}N$ ($0 \le x \le 1$, $0 \le y \le 1$) based semiconductor and may have an energy band gap higher than an energy band gap of the active layer 114. The electron blocking layer may efficiently block electrons which are injected with a p-type ion and overflowed, thereby increasing hole injection efficiency.

In the embodiment, the second conductive semiconductor layer 116 may be a Group III-V compound semiconductor layer doped a second conductive dopant. For example, the second conductive semiconductor layer 116 may include a semiconductor material having a composition formula of $In_xAl_yGa_{1-x-y}N$ ($0 \le x \le 1$, $0 \le y \le 1$, $0 \le x+y \le 1$), and may be formed of a single layer or multiple layers. In the case in which the second conductive semiconductor layer 116 is a p-type semiconductor layer, the second conductive dopant may include Mg, Zn, Ca, Sr, and Ba as a p-type dopant.

Next, a part of the second conductive semiconductor layer 116 and a part of the active layer 114 may be removed, so that a part of the first conductive semiconductor layer 112 may be exposed.

In the embodiment, a light-transmitting ohmic layer 120 may be formed on the second conductive semiconductor layer 116, and a second electrode 140 may be formed on the light-transmitting ohmic layer 120 and the first electrode 130 may be formed on the exposed first conductive semiconductor layer 112.

The light-transmitting ohmic layer 120 may be formed by stacking a single metal, a metal alloy, a metal oxide, or the like in multiple layers so as to efficiently perform carrier injection. The light-transmitting ohmic layer 120 may be formed of a light-transmitting electrode, thereby increasing light extraction efficiency and lowering an operating voltage, so that reliability may be improved.

For example, the light-transmitting ohmic layer 120 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, or a combination thereof, but is not limited to these materials.

The light-transmitting ohmic layer 120 may be 40 to 60 nm. When the thickness of the light-transmitting ohmic layer 120 is less than 40 nm, a sheet resistance may be increased and electrical characteristics may be deteriorated, and when the thickness of the light-transmitting ohmic layer 120 is more than 60 nm, light transmittance may be lowered and light extraction efficiency may be lowered.

In the embodiment, the first electrode 130 may include a first pad electrode 132 and a first branched electrode 134 and the second electrode 140 may include a second pad electrode 142 and a second branched electrode 144.

The first electrode 130 or the second electrode 140 may be formed as a single layer or multiple layers, and may be formed of at least any one of titanium (Ti), chromium (Cr), nickel (Ni), aluminum (Al), gold (Au), tungsten (W), molybdenum (Mo), or an alloy thereof, but is not limited thereto.

One of the technical problems of the embodiments is to provide a light emitting device capable of improving optical characteristics of the light emitting device through an inter-electrode distance design considering a current spreading length.

Meanwhile, in the related art, the distance between the first branched electrode and the second branched electrode is maximally spaced apart in order to improve current spreading efficiency, and recently, a small LED chip has been adopted in mobile phones or IT devices. When the area of such a small LED chip is small, for example, the plane of the chip of the light emitting device is a rectangular shape, the length of a short side is about 300 μm or less, so that the area of the chip itself is small, and thus it is not possible to properly improve current spreading efficiency by spacing apart the distance between the branched electrodes as much as possible.

Figure 3:
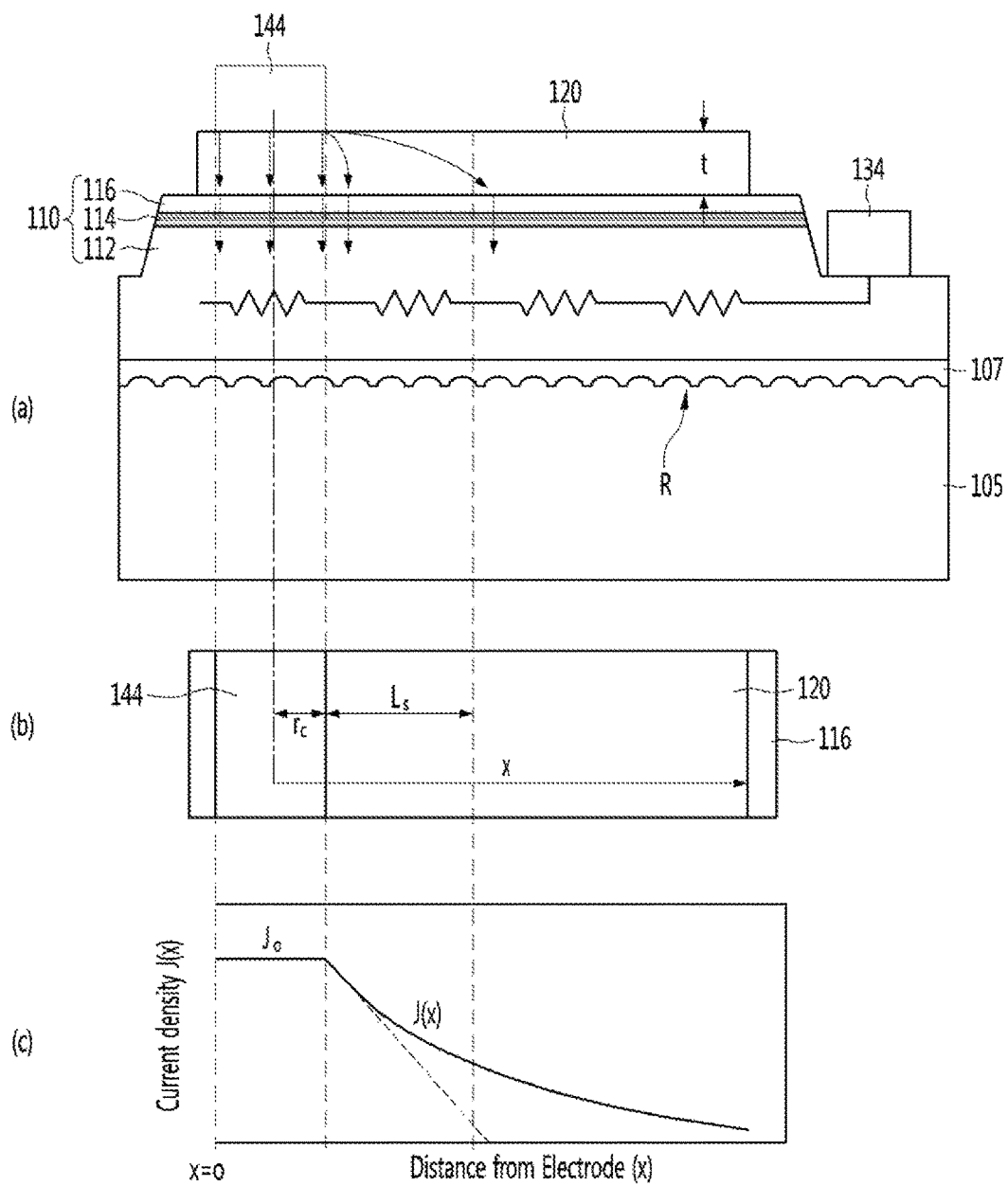
FIG. 3 is a conceptual diagram of current spreading of a light emitting device according to an embodiment.

FIG. 3 is a conceptual diagram of current spreading of a light emitting device according to an embodiment.

For example, a relational expression of a current spreading density (J (x)) according to a distance between electrodes is as shown in the following equation 1.

$$J(x) = \frac{2J_0}{\left[(x-r_c)/L_s + \sqrt{2}\right]^2} \quad (x \geq r_c) \quad \text{[Equation 1]}$$

(where x: a current density spreading length at the center of the second branched electrode 144, rc: half width of the second branched electrode 144, Ls: a current spreading length).

A current spreading length Ls is expressed by the following equation 2.

$$L_s = \left[\frac{tn_{ideal}kT}{\rho J_0 e}\right]^{1/2} \quad \text{[Equation 2]}$$

(where t: the thickness of the light-transmitting ohmic layer, nideal: the diode ideality factor of the light emitting device, ρ: the resistivity of the light-transmitting ohmic layer).

A value of nideal may be obtained by the following Equation 3 (Shockley equation).

$$I = e(V - IRs)/(n_{ideal}kT) \quad \text{[Equation 3]}$$
$$\frac{dV}{dI} = Rs + \frac{n_{ideal}kT}{e}\frac{1}{I}$$

Thereby, when designing the distance (x–rc) between the first branched electrode 134 and the second branched electrode 144 with the current spreading length Ls as described below, the optimum current spreading density (J (x)) may be obtained.

$$x - rc \approx Ls \rightarrow J(x)\uparrow$$

That is, according to the embodiment, in designing an electrode of a light emitting device chip, particularly regarding the design of the distance between the first branched electrode on an n-type semiconductor layer and the second branched electrode on a p-type semiconductor layer, an operation voltage Vf can be lowered by calculating a current spreading length Ls through the analysis of the light emitting device chip and designing a distance between the branched electrodes suitable for Ls, and it is possible to derive an effect that a light output Po is at an equivalent level or increased.

For example, referring to FIG. 1, the light emitting device chip 100 may have a polygonal shape, and the light emitting device chip 100 of the embodiment may have a rectangular shape including a long side and a short side. For example, the light emitting device may include two first sides facing each other and two second sides facing each other. A width L of the first side is greater than a width S of the second side, and the first side and the second side may be orthogonal to each other. The distance between the first branched electrode and the second branched electrode may be ⅙ to ½ of the width of any one of the second sides.

For example, the light emitting device chip 100 of the embodiment may include two long sides facing each other and two short sides facing each other, and the long side and the short side may be orthogonal to each other. The long side may be a long side among the outer edge of the light emitting device chip 100, and the short side may be a relatively short side among the outer edge of the light emitting device chip 100.

In the embodiment, a distance D between the first branched electrode 134 and the second branched electrode 144 may be ⅙ to ½ of the short side width S of the light emitting device. In this case, in the embodiment, since a distance between the second branched electrode 144 and the edge of the light emitting device is controlled to ⅙ to ¼ of the short side width S of the light emitting device, an operating voltage may be decreased and luminous efficiency may be increased as current spreading efficiency is increased. In this case, the edge of the light emitting device may be a nearest edge parallel to the second branched electrode 144. In addition, in the embodiment, since the distance between the second branched electrode 144 and the edge of the light emitting device is controlled to ⅙ to ⅕ of the short side width S of the light emitting device, current spreading efficiency may be further increased.

More specifically, the distance D between the first branched electrode 134 and the second branched electrode 144 will be described. In the case of a small-sized light emitting chip in which the area of the light emitting device of the embodiment is about 300,000 μm² or less, the width S of the short side may be about 200 to 300 μm, and the distance D between the first branched electrode 134 and the second branched electrode 144 may be ⅙ to ½ of the short side width S of the light emitting device. For example, when the area of the light emitting device of the embodiment is about 300,000 μm², the width S of the short side may be about 300 μm, and the width L of the long side may be about 1,000 μm, the distance D between the first branched electrode 134 and the second branched electrode 144 may be about 50 to 150 μm, but is not limited thereto.

In addition, in the case of a small-sized light emitting chip in which the area of the light emitting device of the embodiment is about 300,000 μm² or less, the width S of the short side may be about 200 to 300 μm, and the distance D between the first branched electrode 134 and the second branched electrode 144 may be 3/10 to 11/30 of the short side width S of the light emitting device. For example, when the area of the light emitting device of the embodiment is about 300,000 μm², the width S of the short side may be about 300 μm, and the width L of the long side may be about 1,000 μm, and since the distance D between the first branched electrode 134 and the second branched electrode 144 is controlled to about 90 to 110 μm, current spreading efficiency may be further improved.

According to the embodiment, in designing an electrode of a light emitting device chip, particularly regarding the design of the distance between the first branched electrode 134 on an n-type semiconductor layer and the second branched electrode 144 on a p-type semiconductor layer, the operation voltage Vf can be lowered by calculating a current spreading length Ls through the analysis of the light emitting device chip and control of the distance D between the branched electrodes suitable for Ls, and there is a technical effect that the light output Po is at an equivalent level or increased.

For example, in a lateral chip dimension for an IT or a mobile phone, the width S of the short side may be determined within a range of about 200 to 300 μm, and the long side may be determined within the entire chip area of 300,000 μm² or less. The light emitting device of the embodiment may be a small LED chip, and the plane area thereof may be about 300,000 μm² or less. In addition, the light emitting device of the embodiment may include a rectangular planar shape, and may include two long sides facing each other and two short sides facing each other, and a width S of any one short side may be about 200 to 300 μm, but is not limited thereto.

Since the distance D between the first branched electrode 134 and the second branched electrode 144 contributes to the improvement of the operating voltage Vf and the light output Po, it is necessary to optimally design the distance D between the branched electrodes in consideration of the current spreading length Ls of the chip.

For example, when the area of a lateral chip for an IT or a mobile phone is 300,000 μm² or less and the short side width S is about 200 to 300 μm, the distance D between the first branched electrode 134 and the second branched electrode 144 may be designed to be about 50 to 150 μm. In addition, in the embodiment, when the distance between the first branched electrode 134 and the second branched electrode 144 is 90 to 110 μm, the optical characteristics may be further improved as shown in the following Table 1.

TABLE 1

| | Distance Between Branched Electrodes | Vf | Po (@ 20 mA) |
|---|---|---|---|
| Comparative Example | 175 μm | 2.85 | 31.7 |
| Experimental Example | 110 μm | 2.83 | 31.8 |

For example, when the current spreading length Ls of the chip of the test subject is calculated according to Equation 2, resulting in 110 μm, Table 1 shows the results of the operating voltage Vf and the luminous intensity Po data when the distances between the branched electrodes are different as in the experimental example and the comparative example in Table 1.

According to the example, unlike the comparative example, when the distance D between the first branched electrode 134 and the second branched electrode 144 is controlled to 1/6 to 1/2 of the short side width S of the light emitting device as in the experimental example, the operating voltage Vf decreased and the luminous intensity Po also increased.

Figure 4:
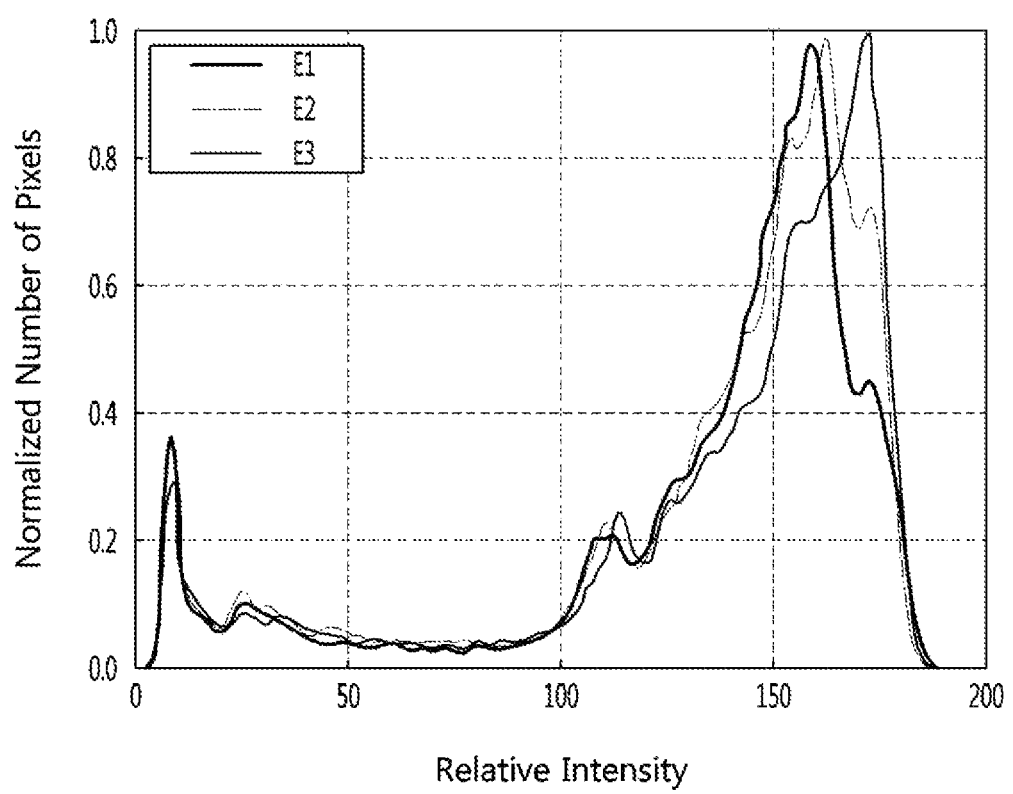
FIG. 4 is first data of a characteristic change of a light emitting device according to an embodiment.
Figure 5:
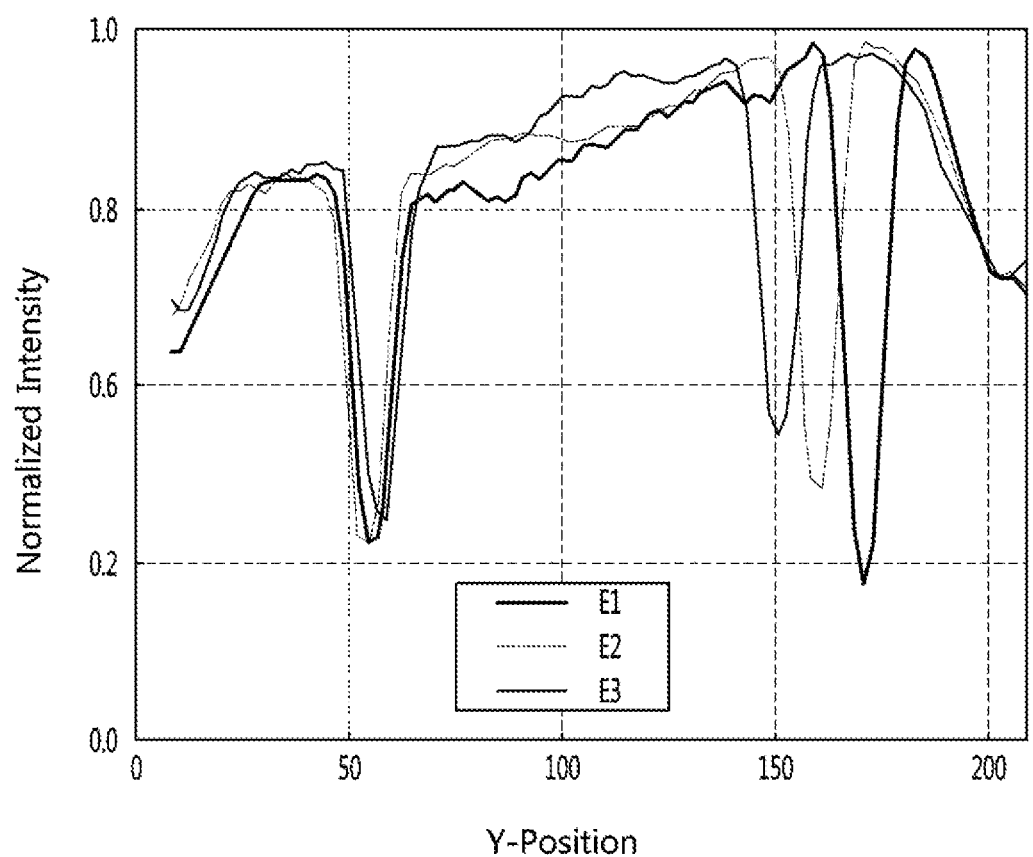
FIG. 5 is second data of a characteristic change of a light emitting device according to an embodiment.

FIG. 4 is first characteristic data of a light emitting device according to an embodiment, and FIG. 5 is second characteristic data of a light emitting device according to an embodiment.

For example, the chip design information for a first experiment (E1), a second experiment (E2), and a third experiment (E3) in FIG. 4 is shown in the following Table 2.

TABLE 2

| | High Speed Sweep | | | Distance Between Branched | |
|---|---|---|---|---|---|
| @20 mA | Vf (V) | Rs | n | Electrodes (μm) | Po (mW) |
| E1 | 2.88 | 6.63 | 1.19 | 110 | 31.5 |
| E2 | 2.87 | 6.30 | 1.24 | 100 | 31.7 |
| E3 | 2.86 | 6.21 | 1.12 | 90 | 31.8 |

As shown in FIG. 4, the intensity (X-axis data) may be shifted upward to the right side as the distance between the branched electrodes changes from about 110 μm to about 90 μm. That is, as the second branched electrode moves to the inside of the chip and as the degree of coincidence between the distance between the electrodes and the current spreading length Ls is higher, the operating voltage Vf decreases and the luminous intensity Po may be improved.

In addition, as shown in FIG. 5, as the second branched electrode moves to the inside of the chip and as the degree of coincidence between the distance between the electrodes and the current spreading length Ls is higher, the intensity of a center region of the chip located between the branched electrodes increases to improve light emission characteristics, so that the operation voltage Vf decreases and the luminous intensity Po may be improved. In FIG. 5, Y position may indicate a position on a line passing through two branched electrodes so as to be parallel to the short side of the light emitting device chip.

Referring again to FIG. 1, in the embodiment, the first branched electrode 134 and the second branched electrode 144 may be disposed in parallel with each other. Therefore, in the light emitting device according to the embodiment, current spreading efficiency between the branched electrodes is increased, so that an operating voltage decreases and luminous efficiency may be increased.

In addition, in the embodiment, the length of the first branched electrode 134 and the length of the second branched electrode 144 may be formed equal to or similar to each other, and may be disposed so as to overlap each other in the short side direction. Accordingly, current spreading efficiency is increased by controlling the current spreading length uniformly, and there is a technical effect of increasing luminous efficiency and decreasing an operating voltage.

The embodiment may provide a light emitting device which is capable of enhancing optical characteristics of the light emitting device through designing a distance between electrodes considering a current spreading length.

For example, according to the embodiment, in designing an electrode of a light emitting device chip, particularly regarding the design of the distance between the first branched electrode on an n-type semiconductor layer and the second branched electrode on a p-type semiconductor layer, the operation voltage Vf can be lowered by calculating a current spreading length Ls through the analysis of the light emitting device chip and designing a distance between the branched electrodes suitable for Ls, and there is a technical effect that the light output Po is at an equivalent level or increased.

Figure 6:
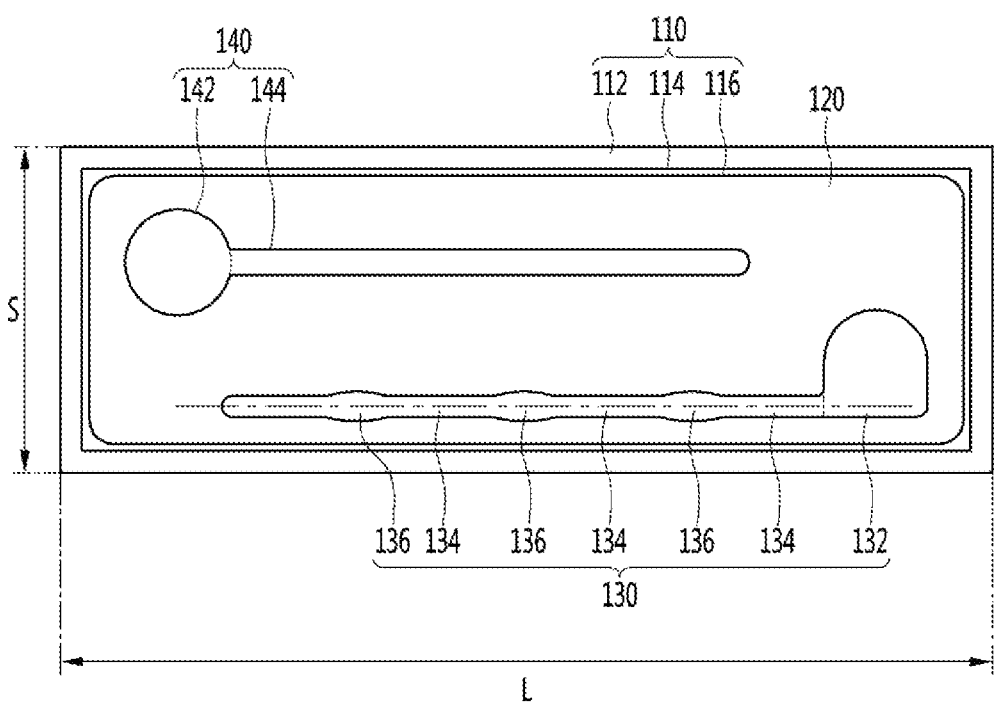
FIG. 6 is a plan view of a light emitting device according to a second embodiment.
Figure 7:
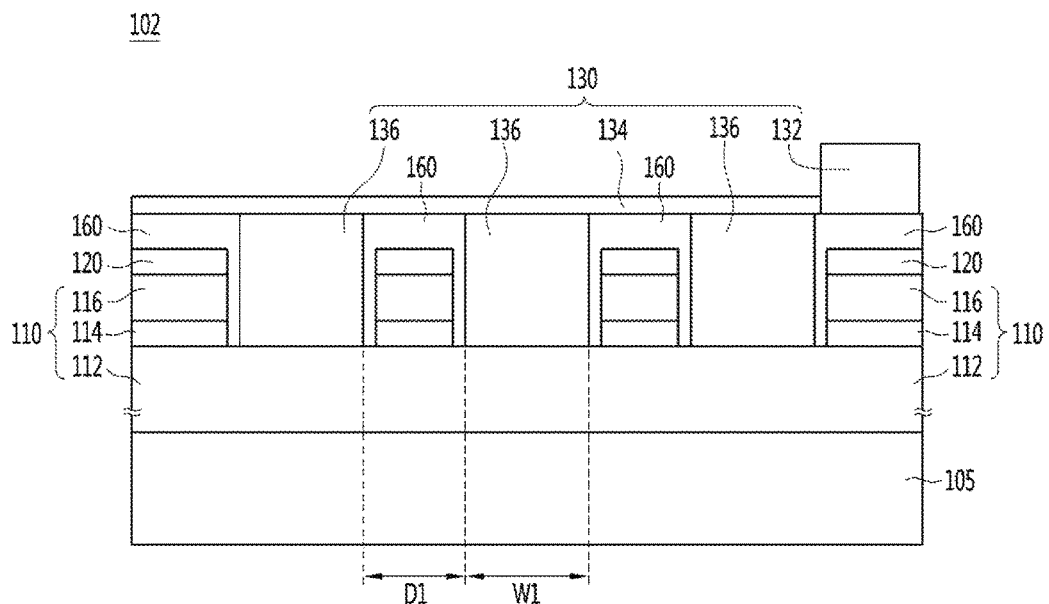
FIG. 7 is a partial cross-sectional view of a light emitting device according to the second embodiment.

FIG. 6 is a plan view of a light emitting device 102 according to a second embodiment, and FIG. 7 is a partial cross-sectional view of the light emitting device 102 according to the second embodiment.

The second embodiment may adopt the technical features of the first embodiment, and the following description will focus on the main features of the second embodiment.

As shown in FIGS. 6 and 7, the light emitting device 102 according to the second embodiment may include a substrate 105, a first conductive semiconductor layer 112 on the substrate 105, an active layer 114 on the first conductive semiconductor layer 112, a second conductive semiconductor layer 116 on the active layer 114, a light-transmitting ohmic layer 120 on the second conductive semiconductor layer 116, an insulating layer 160 on the light-transmitting ohmic layer 120, a first branched electrode 134 electrically connected to the first conductive semiconductor layer 112, a plurality of penetrating electrodes 136 connected to the first branched electrode 134 and electrically connected to the first conductive semiconductor layer 112 by passing through the insulating layer 160, and a first pad electrode 132 electrically connected to the first branched electrode 134.

According to the second embodiment, since the first branched electrode 134 includes the penetrating electrode 136 contacting the first conductive semiconductor layer 112 through a through hole (not shown), the area where the active layer 114 is removed may be reduced to secure a relatively wide area of the active layer, thereby improving luminous efficiency.

In addition, according to the second embodiment, since the area of the penetrating electrode 136 of the first electrode in contact with the first conductive semiconductor layer 112 is sufficiently secured to prevent an increase in an operating voltage, thereby maximizing reliability and luminous efficiency of an element.

For example, since a first lateral width W1 of any one of the penetrating electrodes 136 electrically connected to the first conductive semiconductor layer 112 is greater than a first distance D1 between two adjacent first penetrating electrodes 136, the area of the penetrating electrode 136 electrically connected to the first conductive semiconductor layer 112 is sufficiently secured to prevent an increase in an operating voltage, thereby increasing reliability of the light emitting device.

In the second embodiment, the first lateral width W1 of the penetrating electrode 136 electrically connected to the first conductive semiconductor layer 112 may be 2.5 times or more the first distance D1 between the penetrating electrodes 136.

For example, the first lateral width W1 of any one of the penetrating electrodes 136 may be about 50 µm or more, and the first distance D1 between the penetrating electrodes 136 may be about 20 µm, but is not limited thereto.

For example, the first lateral width W1 of any one of the penetrating electrodes 136 may be about 50 to 70 µm, and the first distance D1 between the penetrating electrodes 136 may be about 15 to 25 µm, but is not limited thereto. When the first lateral width W1 of any one of the penetrating electrodes 136 is less than 50 µm, the effect of reducing an operating voltage may be low, and when the first lateral width W1 is more than 70 µm, a removed area of the active layer is increased, the entire light emitting area is reduced, and thus the light output may be lowered. When the first distance D1 between the penetrating electrodes 136 is less than 15 µm, the volume of the active layer is small and the light emitting region may be small, and when the first distance D1 is more than 25 µm, an increase in an operating voltage may occur.

Figure 8:
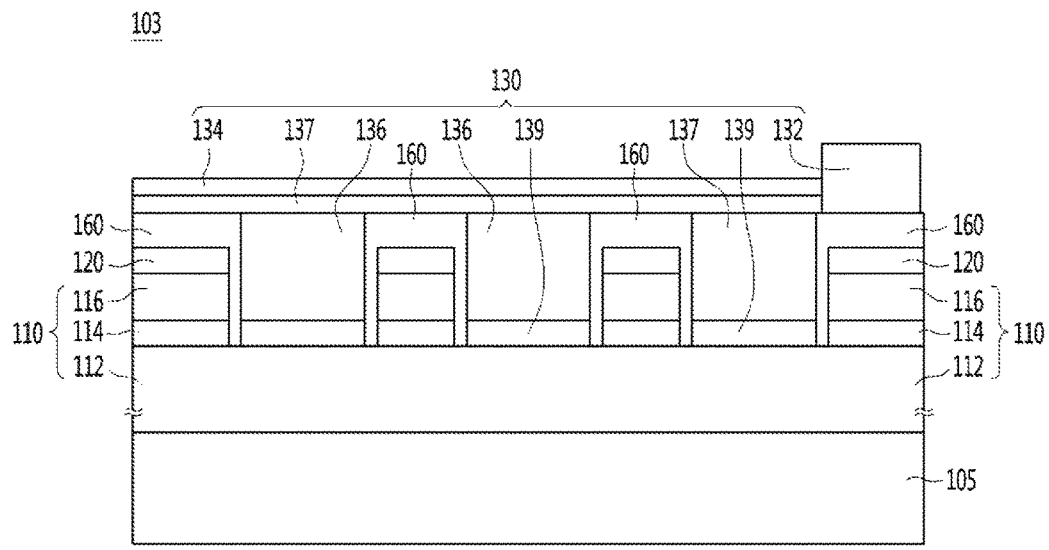
FIG. 8 is a partial cross-sectional view of a light emitting device according to a third embodiment.

FIG. 8 is a partial cross-sectional view of a light emitting device 103 according to a third embodiment.

The third embodiment may adopt the technical features of the first embodiment or the second embodiment, and the following description will focus on the main features of the third embodiment.

According to the third embodiment, the first electrode 130 may include a first ohmic branched electrode 139 in contact with the first conductive semiconductor layer 112 and a first reflective branched electrode 137 disposed on the penetrating electrode 136.

According to the third embodiment, since the ohmic characteristics between the penetrating electrode 136 and the first conductive semiconductor layer 112 is maximized by adopting the first ohmic branched electrode 139 in contact with the first conductive semiconductor layer 112, electrical reliability may be increased by reducing an operating voltage.

For example, the first ohmic branched electrode 139 may include at least one of Cr, Ni, Ti, Rh, Pd, Ir, Ru, Pt, Au and Hf or combinations thereof, but is not limited thereto.

In addition, according to the third embodiment, the first electrode 130 includes the first reflective branched electrode 137 on a lower side of the first branched electrode 134, so that absorption of light by the first branched electrode 134 is minimized and external light extraction efficiency may be increased.

The first reflective branched electrode 137 may be formed to include at least one of Ag, Al, Ni, Ti, Rh, Pd, Ir, Ru, Mg, Zn, Pt, Au, and Hf or a combination thereof, but is not limited thereto.

The first reflective branched electrode 137 may be formed of a plurality of layers, but is not limited thereto. For example, the first reflective branched electrode 137 may be formed of Al/Ni or Ag/Ni in the case of two layers, or may be provided with a distributed Bragg reflector (DBR) in the case of a single layer, but is not limited thereto.

Figure 9:
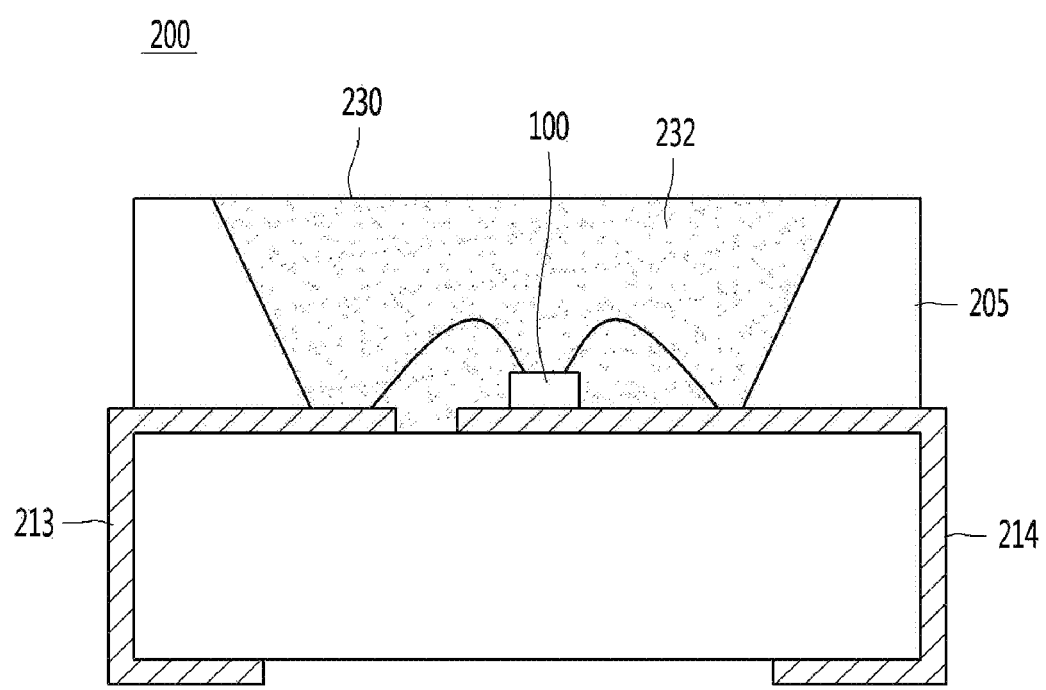
FIG. 9 is a cross-sectional view of a light emitting device package according to an embodiment.

FIG. 9 is a view illustrating a light emitting device package in which a light emitting device according to embodiments is installed.

A light emitting device package 200 according to an embodiment includes a package body portion 205, a third electrode layer 213 and a fourth electrode layer 214 installed on the package body portion 205, a light emitting device 100 installed on the package body portion 205 and electrically connected to the third electrode layer 213 and the fourth electrode layer 214, and a molding member 230 having a phosphor 232 and surrounding the light emitting device 100.

The third electrode layer 213 and the fourth electrode layer 214 are electrically separated from each other and may supply power to the light emitting device 100. In addition, the third electrode layer 213 and the fourth electrode layer 214 may serve to increase optical efficiency by reflecting light generated from the light emitting device 100, and may also serve to exhaust heat generated from the light emitting device 100 to an outside.

The light emitting device 100 may be electrically connected to the third electrode layer 213 and/or the fourth electrode layer 214 by any one of wire, flip chip, and die bonding methods.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it would be construed that contents related to such a combination and such a variation are included in the scope of the present invention.

Embodiments are mostly described above. However, they are only examples and do not limit the present invention. A person skilled in the art may appreciate that several variations and applications not presented above may be made without departing from the essential characteristic of embodiments. For example, each component particularly represented in embodiments may be varied. In addition, it should be construed that differences related to such a variation and such an application are included in the scope of the present invention defined in the following claims.

INDUSTRIAL APPLICABILITY

A light emitting device according to an embodiment may be applied to a backlight unit, a lighting unit, a display device, a pointing device, a lamp, a street lamp, a light emitting device for a vehicle, a display device for a vehicle, a smart watch, and the like, but is not limited thereto.

A plurality of light emitting devices according to the embodiment may be arranged on a substrate in the form of a package. A light guide plate, a prism sheet, a diffusion sheet, a fluorescent sheet, etc., which are optical members, may be disposed on a path of light emitted from a light emitting device package of an embodiment.

The invention claimed is:

1. A light emitting device comprising:
a first conductive semiconductor layer;
an active layer on the first conductive semiconductor layer;
a second conductive semiconductor layer on the active layer;
a light-transmitting ohmic layer on the second conductive semiconductor layer;
a first electrode electrically connected to the first conductive semiconductor layer; and
a second electrode on the light-transmitting ohmic layer,
wherein the first electrode includes a first pad electrode and a first branched electrode, and the second electrode includes a second pad electrode and a second branched electrode,
wherein the light emitting device includes two first sides facing each other and two second sides facing each other, and a width of the first sides is greater than that of the second sides, and the first sides and the second sides are orthogonal to each other, and a distance between the first branched electrode and the second branched electrode is $1/6$ to $1/2$ of the width of any one of the second sides,
wherein the first branched electrode is closest to one of the first sides, and the second branched electrode is closest to another one of the first sides, and
wherein the width of any one of the second sides is 200 to 300 μm, and the distance between the first branched electrode and the second branched electrode is 50 to 150 μm.

2. The light emitting device of claim 1, wherein an area of an upper side of the light emitting device is 300,000 μm$^2$ or less, and
the distance between the first branched electrode and the second branched electrode is 90 to 110 μm.

3. The light emitting device of claim 1, wherein a second distance between the second branched electrode and an edge of the light emitting device is $1/6$ to $1/4$ of the width of the second side,
wherein the edge of the light emitting device is a nearest edge parallel to the second branched electrode.

4. The light emitting device of claim 1, wherein a second distance between the second branched electrode and an edge of the light emitting device is $1/6$ to $1/5$ of the width of the second side.

5. The light emitting device of claim 1, wherein a thickness of the light-transmitting ohmic layer is 40 to 60 nm.

6. The light emitting device of claim 2, wherein the distance between the first branched electrode and the second branched electrode is $3/10$ to $11/30$ of the width of the width of the second side.

7. The light emitting device of claim 1, wherein the light emitting device is included in a light emitting device package comprising:
a third electrode layer and a fourth electrode layer electrically coupled to the light emitting device;
a package body portion provided on the third electrode layer and the fourth electrode layer, the package body portion having a cavity to receive the light emitting device; and
a molding member having a phosphor and surrounding the light emitting device in the cavity of the package body portion.

8. The light emitting device of claim 1, wherein the light emitting device is one of a plurality of light emitting devices included in a light emitting apparatus.

9. The light emitting device of claim 1, wherein the first electrode includes only one first branched electrode, and the second electrode includes only one second branched electrode.

10. A light emitting device comprising:
a first conductive semiconductor layer;
an active layer on the first conductive semiconductor layer;
a second conductive semiconductor layer on the active layer;
a light-transmitting ohmic layer on the second conductive semiconductor layer;
a first electrode electrically connected to the first conductive semiconductor layer;
a second electrode on the light-transmitting ohmic layer; and
an insulating layer on the light-transmitting ohmic layer,
wherein the first electrode includes a first pad electrode and a first branched electrode, and the second electrode includes a second pad electrode and a second branched electrode,
wherein the light emitting device includes two first sides facing each other and two second sides facing each other, and a width of the first sides is greater than that of the second sides, and the first sides and the second sides are orthogonal to each other, and a distance between the first branched electrode and the second branched electrode is $1/6$ to $1/2$ of the width of any one of the second sides,
wherein the first branched electrode is closest to one of the first sides, and the second branched electrode is closest to another one of the first sides,
wherein the first electrode includes a plurality of penetrating electrodes connected to the first branched electrode and electrically connected to the first conductive semiconductor layer through the insulating layer, and wherein the first electrode further comprises a first ohmic branched electrode in contact with the first conductive semiconductor layer under the plurality of penetrating electrodes.

11. The light emitting device of claim 10, wherein a first lateral width of any one of the penetrating electrodes electrically connected to the first conductive semiconductor layer is greater than a first distance between two adjacent first penetrating electrodes.

12. The light emitting device of claim 10, wherein an area of the light emitting device is 300,000 µm² or less, the width of the second side is 200 µm to 300 µm.

13. The light emitting device of claim 12, wherein the distance between the first branched electrode and the second branched electrode is 3/10 to 11/30 of the width of the width of the second side.

14. The light emitting device of claim 11, wherein the first lateral width of any one of the penetrating electrodes electrically connected to the first conductive semiconductor layer is 2.5 times or more the first distance between the two adjacent first penetrating electrodes.

15. The light emitting device of claim 14, wherein the first lateral width of any one of the penetrating electrodes is 50 µm or more, and the first distance between the two adjacent first penetrating electrodes is about 20 µm.

16. The light emitting device of claim 15, wherein the first lateral width of any one of the penetrating electrodes is about 50 to 70 µm, and the first distance between the two adjacent first penetrating electrodes is about 15 to 25 µm.

17. The light emitting device of claim 10, wherein a thickness of any one of the penetrating electrodes is greater a thickness of the first branched electrode.

18. The light emitting device of claim 10, wherein the first electrode includes only one first branched electrode, and the second electrode includes only one second branched electrode.

19. A light emitting device comprising:
a first conductive semiconductor layer;
an active layer on the first conductive semiconductor layer;
a second conductive semiconductor layer on the active layer;
a light-transmitting ohmic layer on the second conductive semiconductor layer;
a first electrode electrically connected to the first conductive semiconductor layer; and
a second electrode on the light-transmitting ohmic layer,
wherein the first conductive semiconductor layer includes two first sides facing each other and two second sides facing each other, and a width of the first side is greater than that of the second side, and the first side and the second side are orthogonal to each other,
wherein the first electrode includes a first pad electrode and a first branched electrode extended from the first pad,
wherein the second electrode includes a second pad electrode and a second branched electrode extended from the second pad,
wherein a distance between the first branched electrode and the second branched electrode is 1/6 to 1/2 of the width of any one of the second sides,
wherein a distance between the second branched electrode and a nearest one of the first sides to the second branched electrode is 1/6 to 1/2 of the width of any one of the second sides,
wherein the width of any one of the second sides is less than 300 µm, and
wherein the distance between the first branched electrode and the second branched electrode is less than 110 µm.

20. The light emitting device of claim 19, wherein an area of the first conductive semiconductor layer is 300,000 µm² or less.

21. The light emitting device of claim 19, wherein the width of any one of the second sides is 200 to 300 µm, and
wherein the distance between the first branched electrode and the second branched electrode is less than 90 µm to 110 µm.

* * * * *